US012577168B2

(12) United States Patent
Van Sluytman et al.

(10) Patent No.: US 12,577,168 B2
(45) Date of Patent: Mar. 17, 2026

(54) CMAS-RESISTANT THERMAL BARRIER COATING FOR AERO-ENGINE PARTS

(71) Applicant: HONEYWELL INTERNATIONAL INC., Charlotte, NC (US)

(72) Inventors: Jason Van Sluytman, Phoenix, AZ (US); Vladimir Tolpygo, Phoenix, AZ (US); Leah Hummel, Clearwater, FL (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 1046 days.

(21) Appl. No.: 17/653,812

(22) Filed: Mar. 7, 2022

(65) Prior Publication Data

US 2023/0278930 A1     Sep. 7, 2023

(51) Int. Cl.
C23C 4/11 (2016.01)
C04B 35/488 (2006.01)
(Continued)

(52) U.S. Cl.
CPC .... C04B 35/4885 (2013.01); C04B 35/62222 (2013.01); C23C 4/11 (2016.01); C23C 4/134 (2016.01); C23C 14/083 (2013.01); C23C 14/30 (2013.01); *C04B 2235/3217* (2013.01); *C04B 2235/3225* (2013.01);
(Continued)

(58) Field of Classification Search
CPC ....... C04B 35/4885; C23C 4/11; C23C 4/134; C23C 14/083; C23C 14/30
See application file for complete search history.

(56) References Cited

U.S. PATENT DOCUMENTS 6,329,899 B1   12/2001   Hunt et al.
6,617,049 B2   9/2003   Darolia et al.
(Continued)

FOREIGN PATENT DOCUMENTS

EP      1484427 A2   12/2004
EP      1788122 A1   5/2007
(Continued)

OTHER PUBLICATIONS

Aygun et al, "Novel thermal barrier coatings that are resistant to high-temperature attack by glassy deposits", Acta Materislis, Elsevier, Oct. 17, 2017, pp. 6734-6745, vol. 55, No. 20, Oxford, GB.
(Continued)

*Primary Examiner* — Nathan H Empie
(74) *Attorney, Agent, or Firm* — Ingrassia, Fisher & Lorenz LLP

(57)          ABSTRACT

A method of preparing a coated article is disclosed. The method includes depositing a coating composition on a surface of a substrate to form a calcia-magnesia-alumina-silicate (CMAS)-resistant thermal barrier coating (TBC) thereon and give the coated article. The coating composition comprises from about 3 to about 50 wt. % of one or more rare-earth oxides, from about 45 to about 96.5 wt. % zirconia, and from about 0.5 to about 4 wt. % alumina, each based on the total weight of the coating composition. As deposited, the alumina is distributed substantially homogeneously throughout the CMAS-resistant TBC. A coated part prepared with the method is also disclosed.

11 Claims, 4 Drawing Sheets

(51) Int. Cl.

| | | |
|---|---|---|
| *C04B 35/622* | (2006.01) | |
| *C23C 4/134* | (2016.01) | |
| *C23C 14/08* | (2006.01) | |
| *C23C 14/30* | (2006.01) | |

(52) U.S. Cl.

CPC ................ *C04B 2235/3244* (2013.01); *C04B 2235/5436* (2013.01); *C04B 2235/9669* (2013.01)

(56) References Cited

U.S. PATENT DOCUMENTS

| | | | |
|---|---|---|---|
| 6,620,525 | B1 | 9/2003 | Rigney et al. |
| 6,720,038 | B2 | 4/2004 | Darolia et al. |
| 6,933,061 | B2 | 8/2005 | Nagaraj et al. |
| 7,008,674 | B2 | 3/2006 | Nagaraj et al. |
| 7,226,668 | B2 | 6/2007 | Nagaraj et al. |
| 7,927,722 | B2 | 4/2011 | Schlichting et al. |
| 8,062,759 | B2 | 11/2011 | Fu et al. |
| 8,257,559 | B2 | 9/2012 | Floyd et al. |
| 9,194,242 | B2 | 11/2015 | Lee |
| 9,713,912 | B2 | 7/2017 | Lee |
| 10,179,945 | B2 | 1/2019 | Rosenzweig et al. |
| 10,233,760 | B2 | 3/2019 | Lee |
| 2003/0138660 | A1 * | 7/2003 | Darolia ............... C23C 28/3215 |
| | | | 428/701 |
| 2003/0152797 | A1 * | 8/2003 | Darolia ................. C23C 28/322 |
| | | | 416/241 B |
| 2006/0115660 | A1 * | 6/2006 | Strangman ............. C23C 26/00 |
| | | | 427/372.2 |
| 2007/0116883 | A1 | 5/2007 | Gorman et al. |

| | | | |
|---|---|---|---|
| 2008/0026160 | A1 | 1/2008 | Taylor et al. |
| 2009/0169752 | A1 | 7/2009 | Fu et al. |
| 2009/0199964 | A1 | 8/2009 | Feyet et al. |
| 2010/0255260 | A1 | 10/2010 | Lee et al. |
| 2011/0151219 | A1 | 6/2011 | Nagaraj et al. |
| 2013/0189531 | A1 | 7/2013 | Lee |
| 2013/0224457 | A1 | 8/2013 | Lee |
| 2014/0272197 | A1 | 9/2014 | Lee |
| 2018/0154392 | A1 | 6/2018 | Keshavan et al. |
| 2018/0282851 | A1 | 10/2018 | Ndamka et al. |
| 2018/0371600 | A1 | 12/2018 | Li et al. |
| 2019/0093498 | A1 | 3/2019 | Gong et al. |
| 2019/0202742 | A1 | 7/2019 | Bochiechio et al. |
| 2019/0211696 | A1 | 7/2019 | Keshavan et al. |
| 2019/0308910 | A1 | 10/2019 | Strock |
| 2020/0024718 | A1 | 1/2020 | Rosenzweig et al. |
| 2021/0214838 | A1 | 7/2021 | Ramm et al. |
| 2021/0404050 | A1 | 12/2021 | Lee et al. |
| 2022/0025523 | A1 | 1/2022 | Tolpygo et al. |

FOREIGN PATENT DOCUMENTS

| | | | |
|---|---|---|---|
| EP | 2460595 A2 | 6/2012 | |
| KR | 100390388 B1 * | 7/2003 | ............... C08K 3/22 |
| WO | 2001047704 A1 | 7/2001 | |

OTHER PUBLICATIONS

Tolpygo, Vladimir, "Vapor-Phase CMAS-Induced Degradation of Adhesion of Thermal Barrier Coatings," Springer Science+Business Media, Published online Jan. 24, 2017.

* cited by examiner

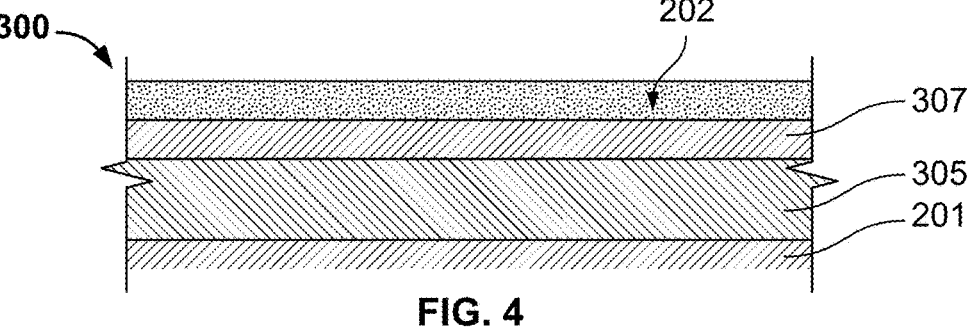
FIG. 4
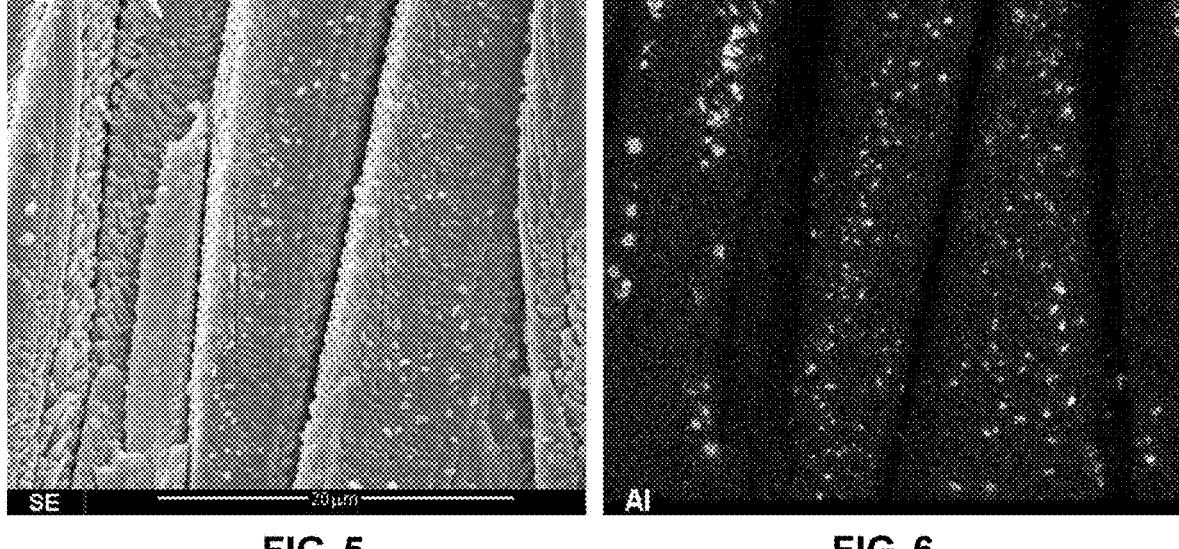
FIG. 5            FIG. 6

CMAS-RESISTANT THERMAL BARRIER COATING FOR AERO-ENGINE PARTS

TECHNICAL FIELD

The present disclosure relates generally to thermal barrier coatings (TBC) and, more specifically, to TBCs for protecting parts from calcia-magnesia-alumina-silicate (CMAS)-induced damage.

BACKGROUND

Many components utilized in high-temperature environments, such as those utilized in gas turbine engines, include parts with a thermal barrier coating (TBC) to protect the part against thermal and/or oxidative damage. As demands for higher turbine efficiency have lead to increasingly high operating temperatures, the need for high-performance TBCs has also increased. Conventional TBCs are typically made of a ceramic material, have low thermal conductivity, and are applied on parts designed to operate in particularly hot sections of the turbine (e.g. blades, vanes, airfoils, etc.). Such parts are typically made from substrates comprising a superalloy, which are susceptible to thermal and oxidative degradation or damage from external sources under normal operating conditions, and thus include the TBC to preserve function and extend the life of the part. Frequently, the TBC is utilized in conjunction with a bond coat for improved adhesion of the TBC to a substrate, as well as to provide additional oxidative resistance to the part.

Unfortunately, conventional TBCs suffer from limited durability and robustness, and may be themselves be susceptible to unavoidable environmentally-related damage. For example, during normal operation, dust (e.g. from ash, sand, salt, etc.) may be ingested into hot sections of the engine, where it can become molten or volatize as hydroxides and react with the TBC. The molten/reactive species from such occurrences is typically referred to as "calcia-magnesia-alumina-silicate" or "calcium magnesium aluminosilicate" (CMAS) due the predominance of these elements therein. However, CMAS-induced damage typically also encompasses damage from other molten/volatile compounds (e.g. salt, sulfur, volcanic ash, etc.) formed from the same process. The reactive CMAS species can penetrate into the TBC via liquid-phase and/or vapor-phase infiltration of CMAS constituents into pores of the TBC over time and cause numerous issues. For example, the CMAS constituents can solidify within the TBC typically result in stiffening and loss of strain compliance of the TBC, and may also promote sintering that ultimately leads to spallation on cooling. Moreover, CMAS-induced damage may lead to weakening of the bond between the TBC and a bond coat being used, e.g. due to chemical reactions between the bond coat surface and reactive CMAS constituents. Complicating matters further, existing manufacturing methods for forming parts with durable and robust TBCs are very limited, with commonly used methods being resource-intensive, expensive, time consuming, and otherwise disadvantageous to broad application and use.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

A method of preparing a coated article (e g manufacturing a part) with a calcia-magnesia-alumina-silicate (CMAS)-resistant thermal barrier coating (TBC) is provided. The method includes depositing a coating composition on a surface of a substrate to form a CMAS-resistant thermal barrier coating (TBC) thereon. The coating composition comprises from about 3 to about 50 wt. % of one or more rare-earth oxides, from about 45 to about 96.5 wt. % zirconia, and from about 0.5 to about 4 wt. % alumina, each based on the total weight of the coating composition. As deposited, the alumina is distributed substantially homogeneously throughout the CMAS-resistant TBC.

A coated part is also provided. The coated part includes a part body and a CMAS-resistant TBC on the part body. The CMAS-resistant TBC is formed from the coating composition comprising from about 3 to about 50 wt. % of one or more rare-earth oxides, from about 45 to about 96.5 wt. % zirconia, and from about 0.5 to about 4 wt. % alumina, each based on the total weight of the coating composition. The coated part includes alumina from the coating composition distributed substantially homogeneously throughout the CMAS-resistant TBC.

Other desirable features and characteristics of the apparatus and method will become apparent from the subsequent detailed description and the appended claims, taken in conjunction with the accompanying drawings and the preceding background.

BRIEF DESCRIPTION OF THE DRAWINGS

The present disclosure will hereinafter be described in conjunction with the following drawing figures, wherein like numerals denote like elements, and wherein:

FIG. 4 is a schematic cross-sectional view of a part coated with the TBC according to embodiments of the present disclosure;

FIG. 5 is an electron micrograph of an alumina-doped TBC prepared according to embodiments of the present disclosure;

FIG. 6 is an Energy dispersive X-ray (EDX) mapped micrograph of the alumina-doped TBC of FIG. 5;

DETAILED DESCRIPTION

The following detailed description is merely exemplary in nature and is not intended to limit the present disclosure or the application and uses of the present disclosure. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the present disclosure and not to limit the scope of the present disclosure which is defined by the claims. Furthermore, there is no intention to be bound by any expressed or implied theory presented in the preceding technical field, background, brief summary, or the following detailed description.

An improved thermal barrier coating (TBC) for protecting parts against calcia-magnesia-alumina-silicate (CMAS)-induced damage is provided herein. The CMAS-resistant TBC provides enhanced durability (e.g. toughness and/or erosion resistance) and broad applicability due to thermal compatibility with common substrates, low thermal conductivity, and high fracture toughness. Accordingly, the CMAS-resistant TBC is suitable for use on aero-engine parts, such as those of a turbine engine illustrated in FIG. 1 and described below, as well as other parts/components used in applications similarly susceptible to CMAS material-induced damage.

Figure 1:
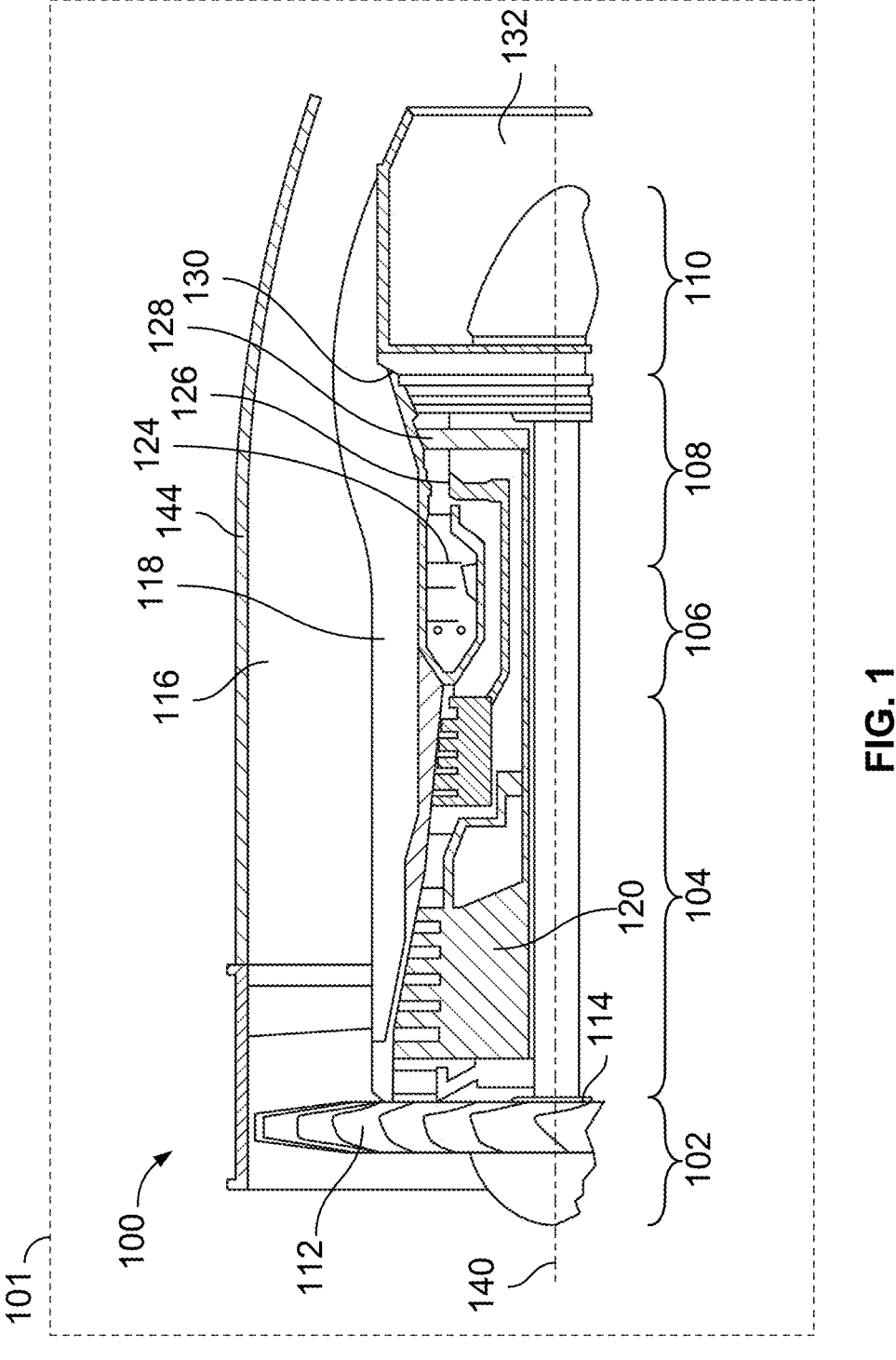
FIG. 1 is a schematic view of a gas turbine engine according to example embodiments of the present disclosure.

With reference to FIG. 1, a partial, cross-sectional view of an exemplary gas turbine engine 100 is shown with remaining portions of the gas turbine engine 100 being substantially axisymmetric about a longitudinal axis 140, which also defines an axis of rotation for the gas turbine engine 100. In the depicted embodiments, the gas turbine engine 100 is an annular multi-spool turbofan gas turbine jet engine within an aircraft (represented schematically at 101), although it is to be understood that features of the present depicted embodiments may be included in other configurations, arrangements, and/or uses consistent with this disclosure. For example, in some embodiments, the gas turbine engine 100 may assume the form of a non-propulsive engine, such as an Auxiliary Power Unit (APU) deployed onboard the aircraft 101, alternatively as an industrial power generator, etc.

The gas turbine engine 100 generally includes a fan section 102, a compressor section 104, a combustor section 106, a turbine section 108, and an exhaust section 110. In one example, the fan section 102 includes a fan 112 mounted on a rotor 114 that draws air into the gas turbine engine 100 and compresses it. A fraction of the compressed air exhausted from the fan 112 is directed through the outer bypass duct 116. The outer bypass duct 116 is generally defined by an outer casing 144 that is spaced apart from and surrounds an inner bypass duct 118. The remaining fraction of the compressed air exhausted from the fan 112 is directed into the compressor section 104, which includes one or more compressors 120. The number of compressors 120, and the configuration thereof, may vary. In general, the one or more compressors 120 sequentially raise the pressure of the air and direct a majority of the high-pressure fluid or air into the combustor section 106. In the combustor section 106, which includes a combustion chamber 124. The high-pressure air is mixed with fuel and is combusted in the combustion chamber 124, with the resulting high-temperature combustion air or combustive gas flow directed into the turbine section 108. The turbine section 108 is shown with three turbines disposed in axial flow series, namely, a high-pressure turbine 126, an intermediate pressure turbine 128, and a low-pressure turbine 130. However, it will be appreciated that the number of turbines, and/or the configurations thereof, may vary. In the embodiments illustrated, the high-temperature combusted air from the combustor section 106 expands through and rotates each turbine 126, 128, and 130. The combustive gas flow then exits the turbine section 108 for mixture with the cooler bypass airflow from the outer bypass duct 116 and is ultimately discharged from the gas turbine engine 100 through the exhaust section 132. As the turbines 126, 128, 130 rotate, each drives equipment in the gas turbine engine 100 via concentrically disposed shafts or spools.

During operation of the gas turbine engine 100, CMAS material (e.g. from dust, sulfur, etc.; not shown) may be ingested at the air inlet (e.g. through the fan section 102) and delivered into the combustor and turbine sections 106, 108. The CMAS may turn molten and/or volatize as hydroxides, which forms are reactive with various components within the combustor and turbine sections 106, 108. In this context, the present embodiments provide a CMAS-resistant TBC configured to reduce, minimize, or prevent deleterious effects from the exposure of parts coated therewith (e.g. parts of the gas turbine engine 100) to the reactive CMAS material forms. More specifically, the CMAS-resistant TBC is configured to be deposited on a surface of such parts as a barrier coating, as described in further detail below, to prevent the reactive forms of CMAS materials from contacting vulnerable portions of the parts.

A method of preparing a coated article, i.e., a part comprising the CMAS-resistant TBC thereon, is also provided. In general, the method of preparing the coated article comprises preparing the CMAS-resistant TBC on a substrate (e.g. a part body) by depositing a coating composition on a surface of the substrate. The coating composition comprises one or more rare-earth (RE) oxides, zirconia, and alumina. The CMAS-resistant TBC prepared with the coating composition comprises a thermal barrier material (e.g. a ceramic) prepared via the selective deposition of the one or more RE oxides and the zirconia. The CMAS-resistant TBC also comprises as alumina distributed substantially homogeneously throughout the thermal barrier material. In particular, the CMAS-resistant TBC is prepared to include distributed alumina particles inside pores and gaps (e.g. inter-columnar gaps) defined by the thermal barrier material, which composes a majority of the CMAS-resistant TBC. In this fashion, the CMAS-resistant TBC is configured to prevent CMAS infiltration, reduce subsequent penetration, and/or mitigate other detrimental CMAS-induced effects by providing a reactive component (e.g. the alumina particles) to react with CMAS materials, fill interstitial spaces via the reaction, and thus block both infiltration and penetration of CMAS materials in portions vulnerable in conventional TBCs. Moreover, the CMAS-resistant TBC is provided with low thermal conductivity and high fracture toughness. Accordingly, the method of the present embodiments provides the CMAS-resistant TBC as a TBC exhibiting desirable physical and performance properties, while also being effective at reducing CMAS material infiltration and related detriments, such as material stiffening and loss of strain compliance, as compared to conventional TBCs.

It will be appreciated in view of the embodiments of the method set forth herein that the processes and chemistries of the method and the structure and properties of the coated article are best understood and illustrated in the context of each other. As such, the coating composition is described below in the general context of the method and relevant TBC chemistries and materials involved therewith, followed by a description of the coated article in the context of the exemplary embodiments shown in the Figures, and further by a description of coating processes suitable for use in carrying out the method to give the coated article.

The preparation method of the present embodiments provides useful and efficient options for delivering and depositing the coating composition to form the CMAS-resistant TBC on various parts, which are described in further detail below. In order to prepare the CMAS-resistant TBC of the present embodiments, the alumina is deposited simultaneously with the one or more RE oxides and the zirconia of the coating composition such that an as-deposited TBC layer is formed as a single phase substantially free from second-phase precipitates. More specifically, the coating composition is typically deposited under controlled conditions via electron-beam physical vapor deposition (EB-PVD) or plasma spraying, whereby the as-deposited TBC layer is be formed by condensing the alumina with the components of the thermal barrier material (i.e., via EB-PVD). The components of the coating composition (i.e., the one or more RE oxides, zirconia, and alumina) are typically provided, together or separately, in a form suitable to be deposited onto a surface of the part via one of the aforementioned processes. For example, in some embodiments, a flow of the components is created by mobilizing the coating composition, e.g. as provided by one or more source materials. The flow (e.g. a vapor, plasma, thermal spray, etc.) may be directed toward the surface of the substrate to be coated, e.g. to condense the one or more RE oxides and zirconia components and form the thermal barrier material in the presence of the alumina.

The thermal barrier material of the CMAS-resistant TBC may comprise a desired structural configuration (e.g. columnar structures, regular pores, etc.) selected by controlling the parameters of the deposition of the coating composition. Accordingly, the CMAS-resistant TBC may exhibit one or more, or all of, the desired physical and/or performance properties afforded by such structural configurations, while also comprising an impediment to CMAS infiltration provided by the CMAS material-reactive alumina particles or reaction products thereof.

During the deposition, the alumina generally collects, precipitates (e.g. after treatment or use involving high-temperature exposure), agglomerates, layers, or otherwise accumulates within the thermal barrier material to give the CMAS-resistant TBC. For example, it will be appreciated from the details herein that that the method may include forming the as-deposited TBC layer as a super-saturated solid solution of alumina in the thermal barrier material. Alternatively, the alumina may be introduced into the thermal barrier material in the form of super-saturated solid solution during plasma spraying, as described in further detail below.

In some embodiments, the method comprises a treatment step comprising exposing the as-deposited TBC layer to an elevated temperature. In practice, the treatment may be carried out as a discrete step, e.g. via intentional heat-treatment. Alternatively, the treatment may be performed in situ during a use or servicing of the coated part. The treatment results in precipitation of the alumina to give alumina particles distributed throughout the thermal barrier material, thereby forming the CMAS-resistant TBC. In this sense, the substantially single-phase as-deposited TBC layer may be considered an intermediate TBC, which can be treated to form the CMAS-resistant TBC soon after the deposition. Alternatively, in some embodiments, the coated article comprising the as-deposited TBC layer may be stored or used as-is until a later treatment is carried out.

In view of the above, an exemplary embodiment of a manufacturing method of the present disclosure may thus include providing a part, subsequently depositing the coating composition on a surface of the part to form the as-deposited TBC layer thereon and, optionally, treating (e.g. heat treating) the as-deposited TBC layer to precipitate alumina particles and form the CMAS-resistant TBC and thereby prepare the coated article.

With regard to the coating composition, the RE oxides suitable for use therein are not especially limited, and may comprise any one or more RE oxides suitable for preparing a thermal barrier via the deposition and treatment processes provided herein. Typically, the one or more RE oxides is selected from yttria ($Y_2O_3$), ytterbia ($Yb_2O_3$), lanthana ($La_2O_3$), gadolinia ($Gd_2O_3$), scandia ($Sc_2O_3$), erbia ($Er_2O_3$), samaria ($Sm_2O_3$), and combinations thereof. In certain embodiments, for example, the one or more RE oxides comprises at least one of yttria, lanthana, and gadolinia. In specific embodiments, the one or more RE oxides of the coating composition consist essentially of yttria, ytterbia, lanthana, gadolinia, erbia, or combinations thereof.

In general, the coating composition comprises from about 3 to about 50 wt. % of the one or more RE oxides, based on the total weight of the coating composition. In specific embodiments, the coating composition comprises a total of from about 3 to about 50 wt. % of the one or more RE oxides, based on the total weight of RE oxides, zirconia, and alumina utilized in the method. The particular amount of any one of the one or more RE oxides will be determined by one of skill in the art based on the desired thermal barrier material being prepared. For example, any one particular RE oxide may be utilized in the amount of from about 3 to about 50 wt. %. Alternatively, a mixture of at least two RE oxides may be used in a combined amount of from about 3 to about 50 wt. %. In this fashion, a particular RE oxide may be present in an amount of less than 3 wt. %. when combined with at least one other RE oxide, with the total weight of all RE oxides in the coating composition being from about 3 to about 50 wt. %, based on the total weight of all RE oxides, zirconia, and alumina utilized in the method.

The coating composition typically comprises the alumina in an amount of from about 0.5 to about 4 wt. %, based on the total weight of the coating composition. In some embodiments, the coating composition comprises the alumina in an amount of from about 0.5 to about 3.5, alternatively from about 0.5 to about 3, alternatively from about 0.5 to about 2.5, alternatively from about 0.5 to about 2 wt. %, based on the total weight of the coating composition. In other embodiments, the coating composition comprises the alumina in an amount of from about 1 to about 4, alternatively from about 1.5 to about 4, alternatively from about 2 to about 4, alternatively from about 2.5 to about 4 wt. %, based on the total weight of the coating composition. In certain embodiments, the coating composition comprises the alumina in one of the aforementioned ranges, where the wt. % is based on the total combined weight of the one or more RE oxides, the zirconia, and the alumina being utilized. At the amounts provided above, the alumina provides the CMAS-resistant TBC with effective CMAS protection, and yet the CMAS-resistant TBC may still exhibit sufficiently low thermal conductivity, effective strain compliance, and high mechanical integrity. Moreover, within the provided ranges the alumina remains thermodynamically stable above a predetermined temperature limit (e.g. a typical operating temperature environment for a part coated with the CMAS-resistant TBC).

In some embodiments, the coating composition further comprises an additional metallic component selected from niobia (Nb$_2$O$_5$), tantala (Ta$_2$O$_5$), and combinations thereof. In certain embodiments, the coating composition consists essentially of the one or more RE oxides, the zirconia, the alumina, and the additional metallic component selected from niobia (Nb$_2$O$_5$), tantala (Ta$_2$O$_5$), and combinations thereof.

The balance of the coating composition typically comprises the zirconia. Specifically, the coating composition typically comprises the zirconia in an amount of from about 45 to about 96.5 wt. %, based on the total weight of the coating composition. In certain embodiments, the coating composition comprises the zirconia in an amount of from about 45 to about 96.5 wt. % based on the total combined weight of the one or more RE oxides, the zirconia, and the alumina being utilized in the method.

In specific embodiments, the coating composition consists essentially of from about 3 to about 50 wt. % of the one or more RE oxides, from about 45 to about 96.5 wt. % zirconia, and from about 3 to about 50 wt. % of one or more rare-earth oxides. It will be understood that term "consists essentially of" in the context of the coating composition will at times necessarily include conventional/standard impurities present in the feedstock materials of the components described. However, in such embodiments, the coating composition is typically free from additional components. For example, in some embodiments the coating composition is substantially free from, alternatively free from, neodymia, silica compounds (e.g. silica, silicates, etc.), and/or RE aluminates. In such embodiments, the thermal barrier material of the CMAS-resistant TBC, as well as the TBC itself, are also substantially free from, alternatively free from, neodymia, silica compounds, and/or RE aluminates. In specific embodiments, the CMAS-resistant TBC is formed on a portion of a part that is free from other alumina-containing barrier coatings or layers (e.g. TBC topcoats comprising alumina, etc.).

It will be appreciated that the given weight ranges of the components above may also be utilized to inform one of skill in the art as to particular ratio(s) of the components of the coating composition, such that the coating composition need not be prepared as a discrete step prior to deposition, but may be instead be prepared in situ, i.e., during the deposition processes described herein.

The alumina of the CMAS-resistant TBC may react with CMAS materials during subsequent exposure, such as during operation of a turbine comprising a part coated with the CMAS-resistant TBC. Generally, the alumina reacts with the CMAS to give solid precipitates that further block the interstitial spaces within the thermal barrier material and thus limit further infiltration of CMAS material therein.

Figure 2:
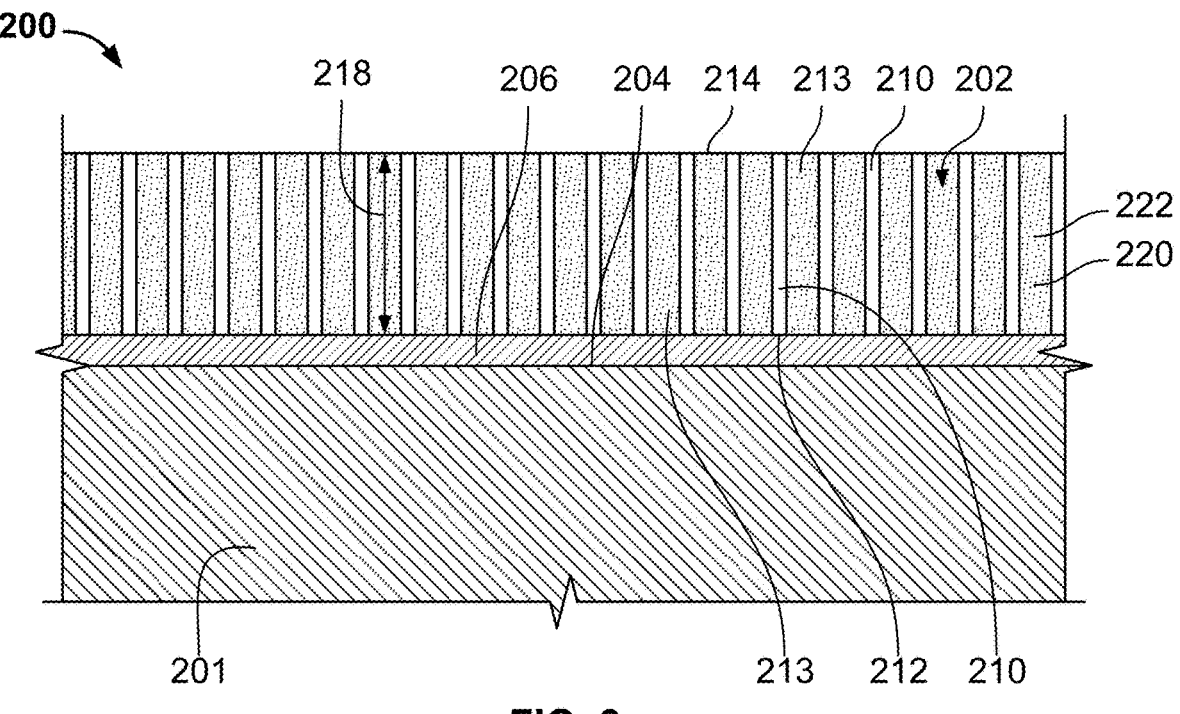
FIG. 2 is a schematic cross-sectional view of a part with a thermal barrier coating (TBC) according to embodiments of the present disclosure.

Referring now to FIG. 2, a part 200 of the gas turbine engine 100 is shown schematically. It will be appreciated that the part 200 may be one of a variety of parts of the gas turbine engine 100 without departing from the scope of the present disclosure. The part 200 may have an airfoil shape. In some embodiments, the part 200 may be included in an area of the engine 100 subjected to high-temperature environments. Thus, the part 200 may be a component of the combustor section 106, a component of the turbine section 108, etc. More specifically, the part 200 may be a blade, a vane, or other component of the turbine section 108. It will also be appreciated that the part 200 may be a component of something other than a gas turbine engine 100 without departing from the scope of the present disclosure.

The part 200 may include a body 201 that defines the majority of the part 200. The part body 201 may be made of any suitable material. For example, in some embodiments, the part body 201 may be made of or include a metallic superalloy (e.g. a nickel-based superalloy). The part body 201 may also include an outer surface 204. The outer surface 204 may be contoured or substantially flat. For example, the outer surface 204 may at least partly define an airfoil shape.

In some embodiments, the part 200 may include an intermediate layer 206, for example, a bond coat 206. In specific embodiments, the bond coat 206 comprises a thin metallic coating on the outer surface 204. For example, in such embodiments, the bond coat 206 may comprise an oxidative protectant, such as a thermally-grown oxide material (e.g. aluminum oxide, etc.). Thus, the bond coat 206 may be a metallic bond coat that provides oxidative protection of the part 200. In some embodiments, the bond coat 206 is substantially free from aluminum-containing materials.

The part 200 includes the CMAS-resistant TBC 202. The CMAS-resistant TBC 202 generally includes an inner boundary 212 that faces the surface 204 (and optionally the bond coat 206), and an outer boundary 214 that faces away from the surface 204. In general, the CMAS-resistant TBC 202 has a thickness 218 of from about 4 to about 8 mil (e.g. from about 0.1 to about 2 mm).

In some embodiments, the CMAS-resistant TBC 202 may be layered on the bond coat 206 with the bond coat 206 disposed in a thickness direction between the inner boundary 212 of the CMAS-resistant TBC 202 and the outer surface 204 of the part body 201. In such embodiments, the bond coat 206 is disposed between and bonds together the CMAS-resistant TBC 202 and the outer surface 204 of the part body 201.

The CMAS-resistant TBC 202 is prepared via depositing a coating composition on the outer surface 204 of the part body 201 or, alternatively, on the intermediate layer 206 (e.g. the bond coat 206). The coating composition includes components configured to give a thermal barrier material 220 and alumina (Al$_2$O$_3$) particles 222, where the alumina particles 222 are distributed substantially homogeneously throughout the thermal barrier material 220 in the CMAS-resistant TBC 202. For example, the alumina particles 222 may be provided in a substantially uniform (i.e., even) distribution within the CMAS-resistant TBC 202 from the inner boundary 212 to the outer boundary 214.

It is to be appreciated that the particular structure of the thermal barrier material 220 will influence or control the particular distribution of the alumina particles 222 throughout the CMAS-resistant TBC 202. For example, where EB-PVD is utilized to deposit the coating composition, the as-deposited TBC layer may be formed via growth of alumina-doped columns of the thermal barrier material 220 (e.g. from a super-saturated solid solution of the alumina in the thermal barrier material 220). In such embodiments, the columnar growth may be carried out substantially unobstructed due to the absence of second-phase precipitates. As such, certain embodiments of this disclosure may provide the CMAS-resistant TBC 202 with reduced, minimized, or no impact on the strain tolerance of the thermal barrier material 220 as compared to similar TBC prepared in the absence of the alumina. In these embodiments, treating the as-deposited TBC layer will typically precipitate the alumina to form the discrete alumina particles 222 on the surface of the columns.

In certain embodiments, plasma spraying is utilized to deposit the coating composition, and the as-deposited TBC layer may be formed with the alumina residing primarily within pores and inter-splat gaps of the thermal barrier material 220. In such embodiments, treating the as-deposited TBC layer will typically precipitate the alumina to give the alumina particles 222 within such pores and inter-splat gaps of the thermal barrier material 220.

The microstructure of the CMAS-resistant TBC 202 may include a plurality of voids 210 (i.e., pores, gaps, etc.), as represented schematically in FIG. 2. More specifically, for sake of representation the CMAS-resistant TBC 202 is shown as defining a plurality of columns 213 that extend longitudinally away from the part body 201 of the part 200, with the voids 210 defined between the respective columns 213. In such a configuration, the voids 210 may increase the strain compliance of the CMAS-resistant TBC 202. For example, in some embodiments, the part body 201 may have a significantly higher rate of thermal expansion than the CMAS-resistant TBC 202. The voids 210 may provide a degree of strain compliance to the CMAS-resistant TBC 202 for accommodating thermal mismatch between the CMAS-resistant TBC 202 and the part body 201.

Although the columns 213 and voids 210 are represented in FIG. 2 as having a uniform size, a uniform alternating arrangement, etc., those of skill in the art will recognize that those features are illustrated schematically for simplicity and appreciate that, in actuality, the columns 213 and voids 210 may not exhibit uniform size, arrangement, etc. Likewise, the columns 213 and voids 210 may not extend continuously from the intermediate layer 206, but instead, some of the columns 213 and/or voids 210 may extend from the intermediate layer 206 and may be covered over in the thickness direction by other columns 213 and/or voids 210. In other embodiments, the plurality of voids 210 may be represented as open, elongate gaps (i.e., cracks) between localized, elongated, (e.g. pancake-shaped splats) of the TBC. Likewise, the voids 210 may define randomly-distributed pores without any particular orientation relative to the outer surface 204.

In some embodiments, the plurality of voids 210 may be represented as open gaps or cracks oriented substantially perpendicular to the outer surface 204 of the part body 201. As will be readily understood by those of skill in the art, instead of including columns 213, the CMAS-resistant TBC 202 may be configured and arranged differently than illustrated without departing from the scope of the present disclosure. The arrangement of the CMAS-resistant TBC 202 (i.e., the columns 213 or other structure) provided herein are for illustration purposes, and the CMAS-resistant TBC 202 may have a different arrangements without departing from the scope of the present disclosure.

Typically, the CMAS-resistant TBC 202 exhibits a low thermal conductivity for thermally protecting the underlying part body 201. With regard to the thermal barrier material 220 as a whole, typically, the thermal barrier material 220 exhibits relatively low thermal conductivity i.e., to impart the low thermal conductivity to the CMAS-resistant TBC 202. For example, the thermal barrier material 220 may exhibit significantly lower thermal conductivity than the material of the part body 201. As such, the thermal barrier material 220 may thermally protect the underlying part body 201.

As described above, the as-deposited TBC layer is typically substantially free of second phase precipitates. To achieve this, the alumina may be included at a level above its solubility in the thermal barrier material 220 prepared from the coating composition to produce a super-saturated solid solution for the as-deposited TBC layer. In this fashion, columns 213 of the alumina-doped thermal barrier material 220 may grow unobstructed by second phase precipitates with minimal, if any, impact on strain tolerance of the columnar TBC structure. However, as also described above, the as-deposited TBC layer is configured to change as a result of exposure to high temperatures, with the alumina particles 222 precipitating from the solid solution to give the CMAS-resistant TBC 202. Specifically, in some embodiments the alumina particles 222 may precipitate as individual particles on the outer boundary 214 and inside the voids 210 at high temperatures. The alumina particles 222 may be between approximately twenty nanometers (20 nm) to one micron ($\mu$) in size. For example, in some embodiments, the alumina particles 222 have a maximum particle size of 1 micron ($\mu$).

Figure 3:
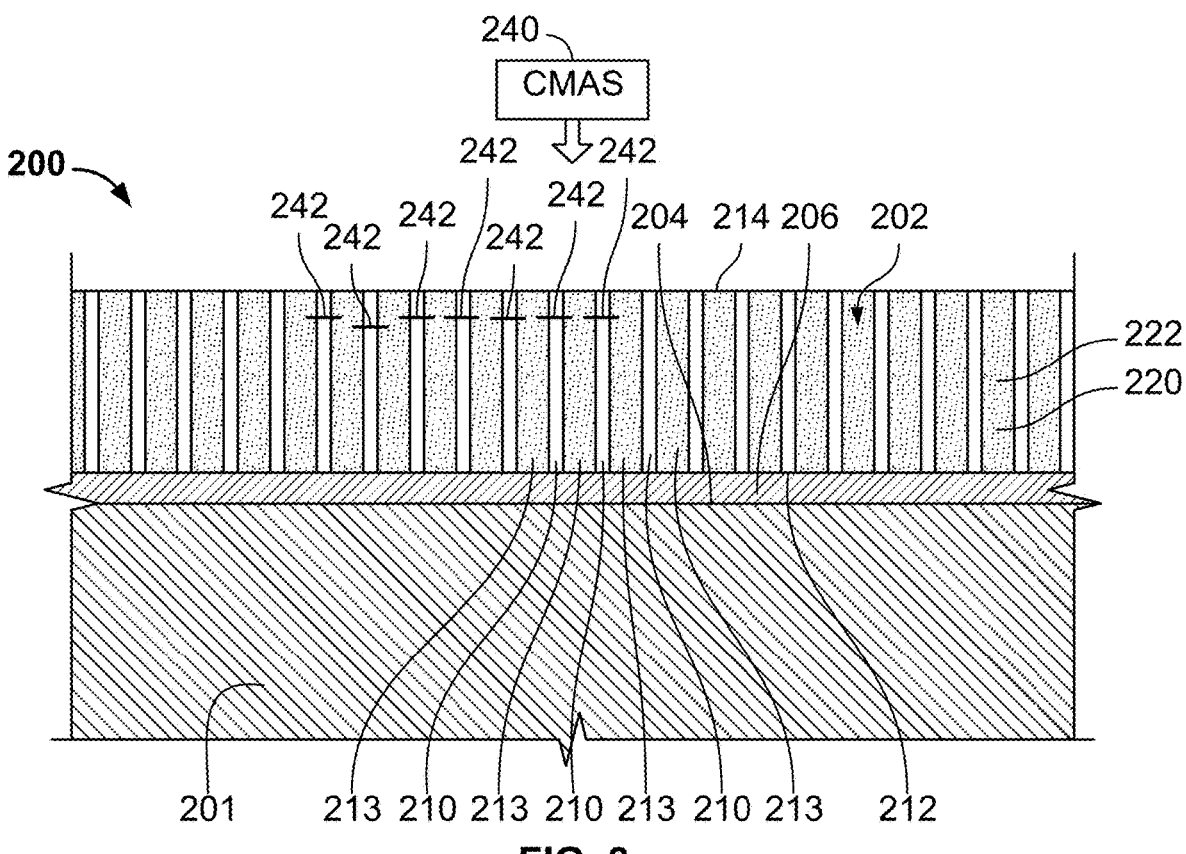
FIG. 3 is a schematic illustration of operation of the TBC of FIG. 2 when exposed to calcia-magnesia-alumina-silicate (CMAS)-type materials.

The general operation of the CMAS-resistant TBC 202 is shown schematically in FIG. 3. The alumina particles 222 may chemically react with CMAS material 240 (e.g. liquid or vapor CMAS material) that is introduced thereto. Specifically, the alumina particles 222 in the voids 210 can chemically react with the CMAS material 240 and form precipitates 242 having crystal structures that limit (i.e., suppress, inhibit, etc.) further penetration of CMAS material 240 into the CMAS-resistant TBC 202. This reaction may increase the melting temperature or viscosity of the CMAS material 240, either of which may further reduce its penetration depth into the CMAS-resistant TBC 202. The precipitates 242 may be solid crystalline phases comprised of one or more constituents, such as anorthite, spinel, etc. The precipitates 242 may block the voids 210 or otherwise restrict further infiltration of CMAS material 240 into the CMAS-resistant TBC 202.

In additional embodiments represented in FIG. 4, the CMAS-resistant TBC 202 may be one of a plurality of thermal coating applications of a coated article 300 prepared from the part body 201. In such embodiments, each thermal coating may be formed via independent coating manufacturing processes. For example, the CMAS-resistant TBC 202 may be an outermost layer of the thermal coating applications of the coated article 300. As such, the alumina particles 222 in the CMAS-resistant TBC 202 may be disposed on the outermost area of the coated article 300 and may define the thermal coating application that is furthest away from the part body 201. The plurality of thermal coating applications of the coated article 300 may include at least one interior application that is disposed (in the thickness direction) between the CMAS-resistant TBC 202 and the part body 201. Specifically, in the embodiments represented in FIG. 4, there may be a first thermal coating application 305 and a second thermal coating application 307 included. However, there may be any number of applications without departing from the scope of the present disclosure. The first and second thermal coating applications 305, 307 may be formed from conventional TBCs, such as rare-earth-doped zirconia ceramics. Moreover, in some embodiments, there may be alternating layers of conventional layers of rare-earth-doped zirconia ceramic and one or more layers of the CMAS-resistant TBC 202 of the type discussed above. In these embodiments, the CMAS-resistant TBC 202 may define a predetermined percentage of the thermal coating applications of the coated article 300. For example, in some such embodiments, the CMAS-resistant TBC 202 may define between ten percent (10%) and ninety percent (90%) of the total thickness of the thermal coating applications on the coated article 300 (e.g. from about 10 to about 90, alternatively from about 10 to about 80, alternatively from about 20 to about 80%, of the total thickness). In specific embodiments, the coated article 300 comprises a first thermal coating application 305 comprising, alternatively consisting essentially of, a TBC prepared from the one or more RE oxides and zirconium of the coating composition described above.

In some embodiments, the first thermal coating application 305 may be substantially the same as the thermal barrier material 220 described with regard to FIG. 2 above, but free from the alumina particles 222. For example, in some such embodiments, each of the first thermal coating application 305 and the CMAS-resistant TBC 202 may compose about fifty percent (50%) of the total thickness of the thermal coating applications on the coated article 300. In specific such embodiments, each of the first thermal coating application 305 and the CMAS-resistant TBC 202 has an average thickness about 5 mil (e.g. from about 0.1 to about 0.15 mm), to achieve a total thickness of thermal barrier layers on the part body 201 of about 10 mil (i.e., about 0.2 to about 0.3 mm).

In some such embodiments, the coated article 300 comprises the part body 201 coated with the first thermal coating application 305, and the CMAS-resistant TBC 202 coated on only a portion of the first thermal coating application 305 (e.g. on a sensitive portion thereof needing increased CMAS-resistance).

As detailed above, the method comprises depositing the coating composition on the surface of a substrate (e.g. the surface 204 of the part body 201 or, alternatively, on the intermediate/bond coat layer 206 when utilized, as represented in FIG. 2), typically via EB-PVD or plasma spraying. The processes of EB-PVD and plasma spraying are well known by those of skill in the art, with standard and conventional techniques suitable for use in the method of the present embodiments. As such, the description of the embodiments herein relating to the method are for example to illustrate and not limit the scope of said embodiments. When plasma spraying is utilized, the coating composition is typically deposited via suspension plasma spraying (SPS) or atmospheric plasma spraying (APS), as will be understood by those of skill in the art. The EB-PVD, SPS, and/or APS processes can be efficient and cost effective, can be scaled, and can be employed repeatably for making coated parts 200 at high volume both simultaneously (e.g. batch production) and sequentially (e.g. in a production line).

Depositing the coating composition generally comprises forming a flow of the coating composition or components thereof, e.g. in the form of vapor, plasma, gas, plume, cloud, atomized particles or droplets, mist, etc.), and contacting the flow to the surface of the substrate to be coated.

The particular method of forming the flow is not limited, and will be selected by one of skill in the art in view of the particular deposition process being employed, a desired structure of the thermal barrier material and TBC being prepared, etc. Typically, the flow of the coating composition thereof is prepared from a source of the coating composition or one or more components thereof. The source may consist essentially of the coating composition or one of more components thereof, or may comprise a carrier or adjuvant to the coating process.

In some embodiments, the deposition is carried out via plasma spraying and the source is a feedstock of the coating composition in the form of a powder or wire comprising, alternatively consisting essentially of, the one or more RE oxide, the zirconia, and the alumina, or a suspension of such a powder. In such embodiments, forming the flow generally comprises delivering the feedstock into a spray tool that utilizes a plasma jet to melt and propel the components of the coating composition (e.g. in the form of molten or semi-molten droplets) toward the surface of the substrate to be coated. The droplets flatten and adhere to the substrate to form a deposit, which is selectively grown to give the as-deposited TBC later on the surface of the substrate in the configurations described above.

When plasma spraying is utilized, the selection of an APS or SPS process will be determined by one of skill in the art based on the properties of the feedstock and the desired microstructure of the TBC being prepared. For example, SPS may be selected when the feedstock comprises ultrafine particles (e.g. <5 μm), which may require being suspended in a slurry by a carrier (e.g. a solvent, such as water, an alcohol, etc.) in order to be delivered to the sprayer with enough momentum to enter the plasma plume. Additionally, SPS may be utilized when a particular microstructure is desired, such as a columnar microstructure formed by flowing the ultrafine particles across the surface of the substrate at a shallow angle and with moderate momentum flow. Such processes may be utilized to form the individual porous columns 213 of the alumina-doped thermal barrier material 220 illustrated in FIG. 2 and described above. In some embodiments, the CMAS-resistant TBC prepared via SPS with such a columnar microstructure may exhibit high strain tolerance and/or performance similar to the CMAS-resistant TBC prepared with EB-PVD columnar structures.

In some embodiments, the method comprises plasma spraying a single feedstock comprising the one or more RE oxides, the zirconia, and the alumina is utilized. In other embodiments, a first feedstock comprising the one or more RE oxides and the zirconia and a second feedstock comprising the alumina, are simultaneously deposited on the substrate via plasma spraying. In these other embodiments, the first and second feedstocks may be fed to the same plasma jet/spray tool, or instead may be sprayed via independent plasma jets/spray tools that are selectively controlled to simultaneously deposit each of the components of the coating composition (i.e., each of the one or more RE oxides, the zirconia, and the alumina) such that the as-deposited TBC layer comprises the alumina distributed substantially homogeneously thought the thermal barrier material formed from the one or more RE oxides and the zirconia.

In certain embodiments, the deposition is carried out via EB-PVD, and the source of the feedstock of the coating composition is a solid ingot of the coating composition, i.e., a solid ingot consisting essentially of the one or more RE oxides, the zirconia, and the alumina, together with the optional additional metallic component if utilized. In such embodiments, the weight ratios of the components are typically as described herein with respect to the coating composition, such that the ingot provides a fully-formulated state of the coating composition for use in the EB-PVD process. In other embodiments, the EB-PVD process is carried out using two ingots, specifically, a first ingot comprising the one or more RE oxide and the zirconia, and a second ingot comprising the alumina. In such embodiments, the additional metallic component may be present in either the first or second ingot (if utilized). Regardless, it will be appreciated that the ratio of the respective components between the ingots will be configured to be substantially equal to the ratio of the components of the coating composition. In this fashion, the first and second ingots are simultaneously consumed to provide the coating composition in situ during the EB-PVD process and form the CMAS-resistant TBC.

When the EB-PVD process is utilized, forming the flow generally comprises vaporizing the ingot(s) (e.g. via electron bombardment) under vacuum to give the coating composition in the form of a vapor. In these embodiments, the vapor is directed to the substrate and allowed to form a deposit thereon (e.g. via precipitation), which is selectively grown to give the as-deposited TBC later on the surface of the substrate in the configurations described above. For example, as will be understood by those of skill in the art, the use of the EB-PVD process allows for the preparation of the CMAS-resistant TBC having the individual porous columns 213 of the alumina-doped thermal barrier material 220 illustrated in FIG. 2 and described above. Accordingly, in some such embodiments, the ingot(s) utilized in the EB-PVD process are configured to comprise the alumina in an among above its solubility in the thermal barrier material, i.e., to prepare a deposit comprising a super-saturated solid solution of the alumina in the thermal barrier material and thus allow the growth of the alumina-doped thermal barrier material 220 without the detriment presence of second-phase precipitates. In such embodiments, the CMAS-resistant TBC may exhibit little to no decrease in strain tolerance as compared to a substantially similar TBC prepared without the alumina.

As will be understood by those of skill in the art, the EB-PVD process may be carried out utilizing an EB-PVD apparatus with standard deposition parameters used in the relevant art. For example, in some embodiments the coating composition can be deposited onto a substrate (e.g. the part body 201) with a well-established pre-grown alpha alumina layer, e.g. via use of emission currents of from about 1 to about 5 amps, coating chamber temperatures of from about 875 to about 1100° C., coating pressures of from about 2.0E-03 to about 1.5E-02 mbar, etc., and combinations thereof.

The part body 201 (and the CMAS-resistant TBC 202 formed thereon) may be treated before installation on the gas turbine engine 100 and/or before the part body 201 is put into full service on the gas turbine engine 100. For example, it may be desirable to form the precipitates 242 on the CMAS-resistant TBC 202 under predetermined, controlled conditions before the engine 100 is put into service. In some embodiments, after the as-deposited TBC layer is formed free of second phase precipitates, the part 200 is selectively exposed to high temperature and to CMAS 240, thus forming the alumina particles 222 and subsequently the protective precipitates 242. Subsequently, the part 200 may be fully installed into the engine 100 and/or otherwise put into full operational service with significant protection against further intrusion of CMAS 240.

In summary, the CMAS-resistant TBC 202 may be strong and robust. Furthermore, the CMAS-resistant TBC 202 may be manufactured efficiently and cost-effectively.

EXAMPLES

The following examples, illustrating various embodiments of this disclosure, are intended to illustrate and not to limit the scope of the embodiments described herein. Unless otherwise noted, all solvents, substrates, and reagents are purchased or otherwise obtained from various commercial suppliers (e.g. Sigma-Aldrich, VWR, Alfa Aesar, etc.) and utilized as received (i.e., without further purification) or as in a form used conventionally in the art, or as prepared from conventional procedures known in the art

Example 1. Alumina-Doped Thermal Barrier Coating: Alumina Particle Precipitation, Distribution, and Characterization A thermal barrier coating is prepared according to the method of the present embodiments. Specifically, a TBC material is prepared via EB-PVD using a coating composition comprising yttria, zirconia, and alumina. The TBC coating material is treated via high-temperature exposure (1149° C., 155 h), and characterized via electron microscopy and energy-dispersive X-ray spectroscopy (EDX) to give an electron micrograph shown in FIG. 5, and an EDX-mapped micrograph aluminum shown in FIG. 6, respectively, which are taken across the same area.

As shown in FIG. 5 and FIG. 6, small aluminum oxide particles (0.1-1 µm) are formed in the TBC after the high-temperature treatment. The aluminum oxide particles are evenly distributed throughout the TBC.

Example 2. Alumina-Doped Thermal Barrier Coating: Spallation Evaluation

A thermal barrier coating is prepared according to the method of the present embodiments. Specifically, EB-PVD is used to prepare a TBC material from an ingot consisting of 3 to 50 wt. % of a mixture of RE oxides, 0.5 to 4 wt. % alumina, and the balance zirconia.

The TBC material (Ex. 2) is evaluated for strain tolerance via thermocycling, with each cycle including a time (30 min) at temperature (1149° C.), a cool down, and a re-heat to temperature. The number of cycles to observed TBC spallation is obtained and normalized against the performance of 7YSZ (7Y) under identical conditions. The results of the evaluation are shown graphically in FIG. 7, with normalized performance values shown along the Y-axis, including a threshold value set at 1.0 for acceptable performance.

Figure 7:
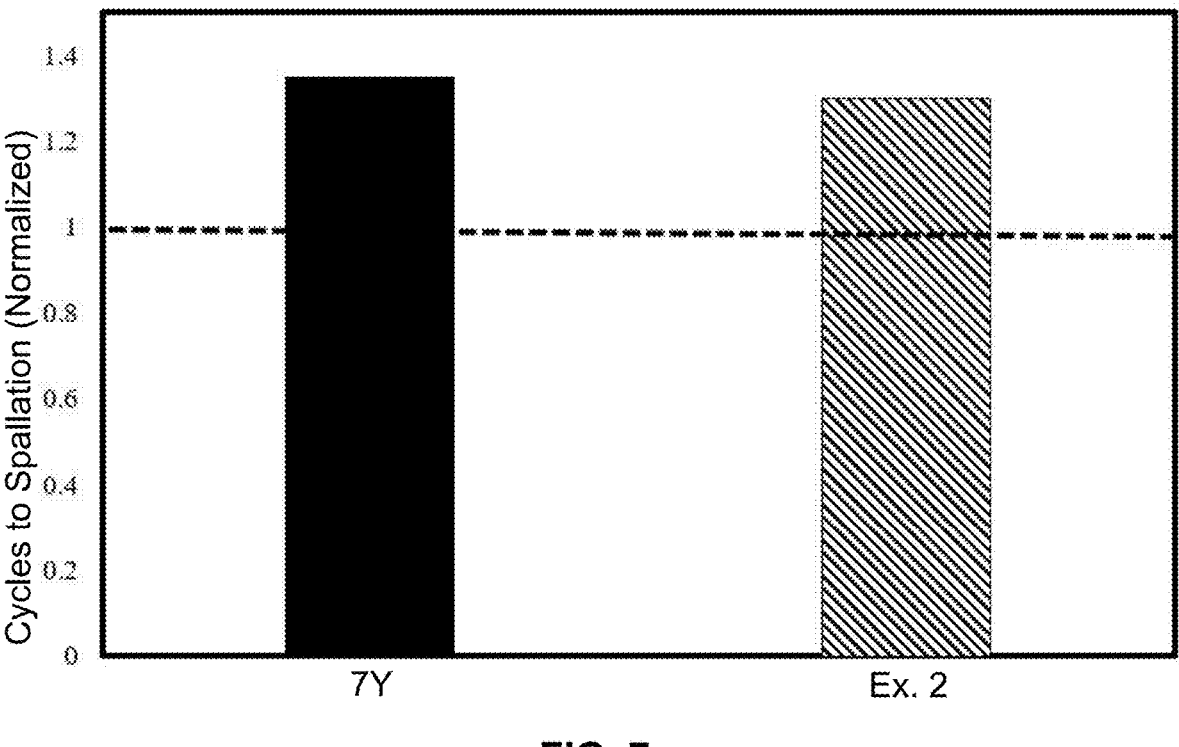
FIG. 7 is a graphical view of the strain-resistance performance of an alumina-doped TBC prepared according to embodiments of the present disclosure normalized against a comparative TBC material.

As shown in FIG. 7, the performance of the alumina-doped TBC material (Ex. 2) exceeds the normalized threshold value, with a similar performance as that demonstrated by 7YSZ (7Y). These results suggest the alumina-doped TBC material (Ex. 2) exhibits a similar strain tolerance to that of 7YSZ (7Y), with no marked detrimental effects on strain tolerance observed from the alumina.

Example 3. Alumina-Doped Thermal Barrier Coating: Erosion Performance

A thermal barrier coating is prepared according to the method of the present embodiments. Specifically, EB-PVD is used to prepare an as-deposited TBC material from an ingot consisting of 3 to 50 wt. % of a mixture of RE oxides, 0.5 to 4 wt. % alumina, and the balance zirconia.

The as-deposited TBC material (Ex. 3) is evaluated as-deposited for erosion at room temperature (RT) against 7YSZ (7Y) across three fixed time points (T1, T2, T3) to give a relative erosion rate. The results of the evaluation are shown graphically in FIG. 8, with RT erosion rate (g/kg) plotted along the Y-axis.

Figure 8:
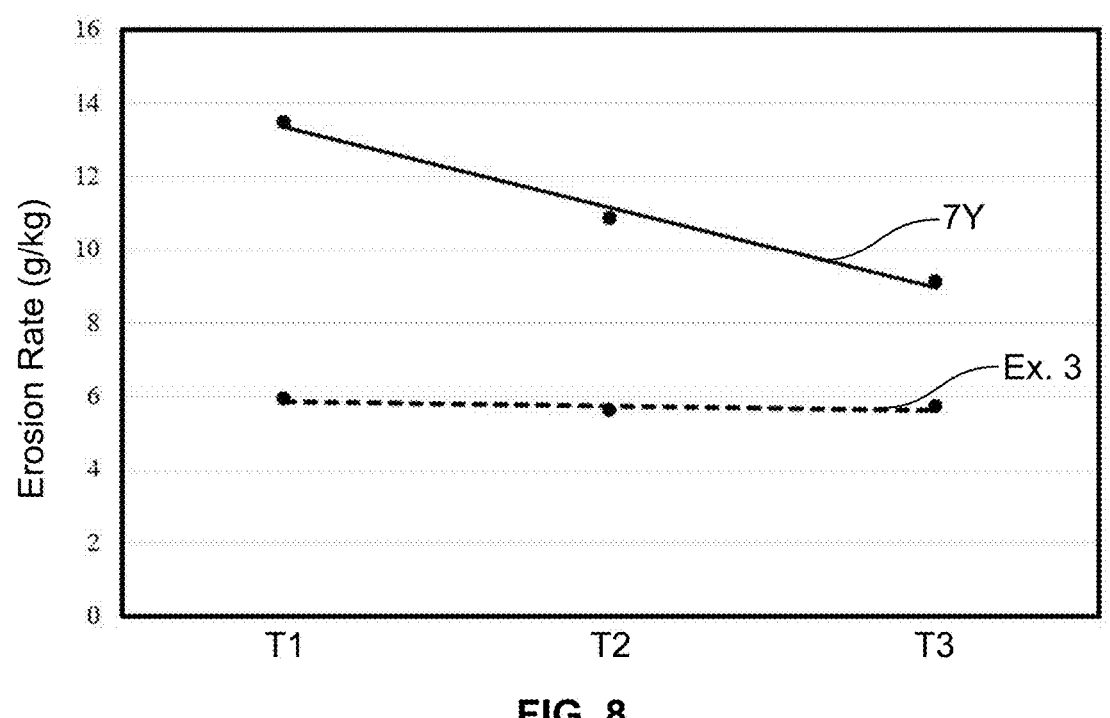
FIG. 8 is a graphical view of the room-temperature erosion performance of an as-deposited alumina-doped TBC prepared according to embodiments of the present disclosure normalized against a comparative TBC material.

As shown in FIG. 8, the as-deposited TBC material (Ex. 3) exhibits lower RT erosion than 7YSZ (7Y) at each time point, and an overall observed RT erosion rate less than that exhibited by 7YSZ (7Y) under the same conditions. These results indicate that the alumina-doped TBC material (Ex. 3) exhibits improved erosion resistance compared to 7YSZ, and suggest the alumina-doped TBC material (Ex. 3) exhibits similar or better intrinsic toughness/durability over compared to 7YSZ (7Y).

As demonstrated by the examples above, the present embodiments provide a robust CMAS-resistant TBC that can be efficiently and effectively prepared. The CMAS-resistant TBC exhibits the same or better performance across a range of evaluations as compared to a leading conventional TBC material, and thus provides a TBC with effective CMAS-resistance with no sacrifice in durability or strain tolerance.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of preparing a coated article, comprising:
  depositing a coating composition on a substrate to form a calcia-magnesia-alumina-silicate (CMAS)-resistant thermal barrier coating (TBC) thereon, the coating composition comprising:
    from about 3 to about 50 wt. % of one or more rare-earth oxides,
    from about 45 to about 96.5 wt. % zirconia, and
    from about 0.5 to about 4 wt. % alumina, each based on the total weight of the coating composition;

wherein depositing the coating composition comprises forming an as-deposited TBC layer having columnar grains, with the alumina present as a super-saturated solid solution distributed throughout the columnar grains such that the as-deposited TBC layer is substantially free from second-phase precipitates during formation of the columnar grains; wherein depositing is carried out via plasma spraying; and
heat treating the as-deposited TBC layer at a temperature sufficient to precipitate the alumina as discrete particles having a maximum particle size of about 1 μm to form the CMAS-resistant TBC with the alumina substantially homogeneously distributed throughout the CMAS-resistant TBC.

2. The method of claim 1, wherein the plasma spraying, and wherein the plasma spraying is selected from suspension plasma spraying (SPS) and atmospheric plasma spraying (APS).

3. The method of claim 2, wherein the coating composition is deposited via plasma spraying using a single feedstock comprising the one or more rare-earth oxides, the zirconia, and the alumina.

4. The method of claim 2, wherein the coating composition is deposited via plasma spraying using, simultaneously, a first feedstock comprising the one or more rare-earth oxides and the zirconia and a second feedstock comprising the alumina.

5. The method of claim 1, wherein the one or more rare-earth oxides is selected from the group of yttria, ytterbia, lanthana, gadolinia, niobia, tantala, scandia, erbia, lanthana, samaria, and combinations thereof.

6. The method of claim 1, wherein the one or more rare-earth oxides comprises at least one of yttria.

7. The method of claim 1, wherein the coating composition consists essentially of the one or more rare-earth oxides, the zirconia, and the alumina, with the remainder being incidental impurities.

8. The method of claim 1, wherein the CMAS-resistant TBC is formed substantially free from neodymia, silica compounds, and/or rare-earth aluminates.

9. The method of claim 1, further comprising forming an intermediate TBC layer disposed between the substrate and the CMAS-resistant TBC, the intermediate TBC layer consisting essentially of the one or more rare-earth oxides and the zirconia utilized in the coating composition.

10. The method of claim 1, wherein the one or more rare-earth oxides comprises lanthana.

11. The method of claim 1, wherein the one or more rare-earth oxides comprises gadolinia.

* * * * *